United States Patent [19]

Nishida et al.

[11] Patent Number: 5,512,516
[45] Date of Patent: Apr. 30, 1996

[54] CONTACT STRUCTURE FOR CONNECTING AN ELECTRODE TO A SEMICONDUCTOR DEVICE AND A METHOD OF FORMING THE SAME

[75] Inventors: Kenji Nishida, Inagi; Noriaki Sato, Machida, both of Japan

[73] Assignee: Fujitsu Limited, Kanaga, Japan

[21] Appl. No.: 315,576

[22] Filed: Sep. 30, 1994

Related U.S. Application Data

[62] Division of Ser. No. 115,242, Aug. 18, 1993, Pat. No. 5,384,485, which is a continuation of Ser. No. 948,622, Sep. 22, 1992, abandoned, which is a continuation of Ser. No. 697,748, May 6, 1991, abandoned, which is a continuation of Ser. No. 354,609, May 22, 1989, abandoned.

[30] Foreign Application Priority Data

May 27, 1988 [JP] Japan ................... 63-129832

[51] Int. Cl.⁶ .............................. H01L 21/283
[52] U.S. Cl. .................. 437/200; 437/190; 437/192; 748/DIG. 19
[58] Field of Search ............... 437/41, 200, 192, 437/190; 748/DIG. 19, DIG. 147

[56] References Cited

U.S. PATENT DOCUMENTS

| | | | |
|---|---|---|---|
| 4,080,719 | 3/1978 | Wilting | 148/DIG. 147 |
| 4,558,507 | 12/1985 | Okabayashi et al. | 437/200 |
| 4,616,401 | 10/1986 | Takeuchi | 437/29 |
| 4,701,349 | 10/1987 | Koyanagi et al. | 437/241 |
| 4,769,686 | 9/1988 | Horiuchi et al. | 257/373 |
| 4,772,571 | 9/1988 | Scovell et al. | 437/200 |
| 4,816,879 | 3/1989 | Ellwanger | 257/486 |
| 4,818,723 | 4/1989 | Yen | 437/200 |
| 4,829,024 | 5/1989 | Klein et al. | 437/189 |
| 4,837,609 | 6/1989 | Gurvitch | 257/383 |
| 4,910,578 | 3/1990 | Okamoto | 257/757 |
| 4,916,508 | 4/1990 | Tsukamoto et al. | 257/385 |
| 4,924,295 | 5/1990 | Kiiecher | 257/758 |
| 4,926,237 | 5/1990 | Sun et al. | 257/764 |
| 4,960,732 | 10/1990 | Dixit et al. | 437/192 |
| 4,962,414 | 10/1990 | Liou et al. | 257/740 |
| 5,006,916 | 4/1991 | Wills | 257/751 |
| 5,027,185 | 6/1991 | Liauh | 257/413 |
| 5,051,805 | 9/1991 | Custode | 257/588 |

FOREIGN PATENT DOCUMENTS

| | | |
|---|---|---|
| 3625860 | 2/1987 | Germany . |
| 58-63165 | 4/1983 | Japan . |
| 58-143570 | 8/1983 | Japan . |
| 61-142739 | 6/1986 | Japan . |
| 61-224414 | 10/1986 | Japan . |
| 62-62555 | 3/1987 | Japan . |
| 62-179723 | 8/1987 | Japan . |
| WO86/01640 | 3/1986 | WIPO . |

OTHER PUBLICATIONS

"Interconnect Materials for VLSI Circuits", Y. Pauleau, 400 Solid State Technology 30 (1987) Apr., No. 4, Port Washington, NY, USA, pp. 155–162.

"New Structure for Contact Metallurgy", C. Y. Ting, IBM Technical Disclosure Bulletin, vol. 25, No. 12, May 1983, pp. 6398–6399.

IEEE Journal of Solid-State Circuits, vol. SC-15, No. 4, Aug. 1980 "Refractory Silicides of Titanium and Tantalum for Low-Resistivity Gates and Interconnects", Murarka, S. P., et al.

Primary Examiner—T. N. Quach
Attorney, Agent, or Firm—Nikaido, Marmelstein, Murray & Oram

[57] ABSTRACT

A contact structure for connecting a semiconductor device to a wiring electrode includes a semiconductor layer forming a part of the semiconductor device. A first contact layer of reduced resistivity covers a surface of the semiconductor layer. An insulating structure is provided on the first contact layer so as to bury the first contact layer underneath. A penetrating hole is opened through the insulating structure so as to expose a part of the first contact layer. A second contact layer of reduced resistivity is provided on the part of the first contact layer exposed by the penetrating hole. The second contact layer extends from a bottom of the penetrating hole along its side wall. A conductor layer forms the wiring electrode on the second contact layer.

7 Claims, 4 Drawing Sheets

CONTACT STRUCTURE FOR CONNECTING AN ELECTRODE TO A SEMICONDUCTOR DEVICE AND A METHOD OF FORMING THE SAME

This is a divisional of application Ser. No. 08/115,242, filed on Aug. 18, 1993, now U.S. Pat. No. 5,384,485, which is a continuation of application Ser. No. 07/948,622, filed on Sep. 22, 1992, abandoned, which is a continuation of Ser. No. 07/697,748, filed on May 6, 1991, abandoned, which is a continuation of application Ser. No. 07/354,609, filed on May 22, 1989, abandoned.

BACKGROUND OF THE INVENTION

The present invention generally relates to fabrication of semiconductor devices and more particularly to a contact structure for connecting an electrode to a semiconductor device and a method of forming the same.

Connection of a wiring electrodes to a semiconductor device is usually achieved through a contact hole provided on an insulator layer such as a silica glass or phosphosilicate glass (PSG) layer covering a part of the device which may be a substrate. In a typical example shown in FIG. 1, an aluminium or aluminium alloy conductor 1 is deposited on a surface of an insulator layer 2 including area of a contact hole 3 by sputtering and the like so that a part 4a of a substrate 4 exposed by the contact hole 3 at its bottom is covered by the conductor 1. When a layer of the conductor having a substantial thickness is formed continuously from the bottom of the contact hole 3 to the surface of the insulator layer 2 along a side wall 3a of the contact hole 3, there is achieved an excellent electrical contact between the substrate and the wiring electrode.

As will be easily understood, the key factor for achieving a successful electrical contact is to cover the side wall 3a of the contact hole 3 uniformly by the conductor having a substantial thickness. However, such a uniform coverage of the side wall is not achieved easily, as the side wall 3a of the contact hole generally extends vertically relative to the substrate 4 so as to reduce the diameter of the contact hole and hence the size of the device. When the conductor 1 such as aluminium or aluminium-silicon alloy is deposited by sputtering as is commonly practiced, the conductor covering the surface of the insulator layer grows laterally into the contact hole 3 and forms an overhang 1a. Under such circumstances, there is no or little deposition of the conductor at the bottom part of the contact hole 3, particularly on the side wall 3a even after a continued effort of deposition. When such a situation occurs, the layer of conductor 1 covering the side wall 3a becomes very thin as illustrated, and in the most extreme case, there is no conductor layer covering such portions. The connecting structure having such a profile is of course unstable and tends to cause disconnection of the electrical contact.

In order to eliminate the aforementioned problem, it is proposed to deposit a metal 5 such as titanium which forms a silicide when reacted with silicon, on the insulator layer 2 including the area of the contact hole 3 prior to the deposition of the conductor layer as shown by broken line in FIG. 2. The device deposited with the metal 5 is then subjected to heat treatment, whereby a layer of silicide 6 is formed so as to cover the substrate 4 in correspondence to the bottom of the contact hole 3 as a result of reaction between the metal 5 and silicon contained in the substrate 4. Further, silicon is transported upwards along the side wall 3a and there is formed a layer of silicide 6a which extends along the side wall 3a of the contact hole. After the heat treatment, the unreacted part of the metal 5 is removed. As the silicide layer 6 is formed by the reaction between the metal and silicon which is supplied from the substrate 4 through the bottom of the contact hole 3, the thickness of the silicide layer 6 is generally largest at the bottom of the contact hole 3 and the silicide layer 6a covering the side wall 3a of the contact hole 3 gradually decreases its thickness from the bottom to the top of the contact hole. In other words, the silicide layer 6 has a concaved inner surface 6b opened upwards. Further, this concaved profile of the inner surface of the silicide layer is formed with reliability even if there is formed an overhang 5a of the metal layer 5 when the metal is initially deposited on the contact hole. This is because there occurs a flow of component element constituting the metal in a direction opposite to the direction of the flow of silicon moving upwards from the substrate to the metal layer, irrespective of the initial profile of the deposited layer 5 of the metal. There is no difficulty in depositing the conductor layer on such a concaved surface 6b of the silicide layer 6 by the conventional procedure such as sputtering. By selecting the metal such that the silicide thus formed has a low resistivity, an excellent contact is achieved between the semiconductor device and the aluminium-based wiring electrode deposited on the silicide layer.

In such a prior art contact structure, there is formed a thick layer of silicide 6c at the bottom of the contact hole as already described. Such a silicide layer has a bottom surface which is generally not flat but has many projections or spikes 6d projecting into the substrate 4 particularly at a region adjacent to a bottom edge 3b of the side wall of the contact hole. Such a projection 6d is formed in a region of the substrate which acts as a source of silicon from which silicon is removed in exchange with incoming flow of the element of the metal such as titanium when the silicide layer 6a is formed along the side wall 3a of the contact hole. It should be noted that it is such a region along the bottom edge 3b of the side wall 3a that supplies most of silicon when the silicide layer 6a is formed along the side wall 3a of the contact hole 3. In conventional semiconductor devices having a relatively deep p-n junction in the substrate, the existence of such a projection of the silicide layer does not cause a serious problem. However, in a semiconductor device having a shallow junction represented schematically by a one-dotted line in FIG. 2 as in the case of very large scale integrated circuits (VLSI) in which a very large number of devices are assembled in a unit area, there is a substantial risk that the spike 6d of silicide 6 thus extending into the substrate 4 causes short-circuit conduction in the shallow junction. In order to avoid such a problem and at the same time to achieve a reliable electrical contact, one has to prevent the excessive projection of the silicide into the substrate.

In a conventional contact structure where the aluminium-based wiring electrode is directly contacted with silicon substrate through the contact hole as in FIG. 1, there arises another problem of reaction between the silicon substrate and the electrode as a result of diffusion of aluminium and silicon as schematically illustrated in FIG. 1. When such a reaction occurs, a spike of aluminium silicide 4b shown by a dotted line in FIG. 1 is formed in the substrate 4 and the p-n junction in the substrate is shorted. In order to prevent such a reaction, a diffusion barrier layer (not shown) which may be a layer of titanium nitride (TiN) or titanium tungstenite (TiW) is provided between the substrate and the wiring electrode so as to block the transportation of aluminium or silicon passing therethrough. In such a conventional contact structure, there is a problem in that the coverage of the substrate at the bottom of the contact hole by the diffusion barrier layer tends to become insufficient because of the reason similar to the case of depositing the conductor layer on the substrate through the contact hole, particularly when the device has a very fine pattern and the contact hole has a correspondingly large aspect ratio which is a ratio of a depth relative to a diameter of the contact hole. This problem is further deteriorated by the limited thickness of the diffusion barrier layer as the thickness of such a diffusion barrier layer is generally limited below about 3000 Å in order to secure a sufficiently low resistance of the contact structure.

SUMMARY OF THE INVENTION

Accordingly, it is a general object of the present invention to provide a novel and useful contact structure wherein the problems aforementioned are eliminated.

Another and more specific object of the present invention is to provide a contact structure for connecting a semiconductor layer forming a part of a semiconductor device to a wiring electrode wherein a reliable contact is obtained between the semiconductor layer and the wiring electrode.

Another object of the present invention is to provide a contact structure for connecting a semiconductor layer forming a part of a semiconductor device to a wiring electrode via a silicide layer formed at a boundary between the semiconductor layer and the electrode as a result of reaction between the semiconductor layer and a metal layer deposited thereon in correspondence to the silicide layer, wherein excessive projection of the silicide layer into the semiconductor layer causing short circuit conduction in a p-n junction in the semiconductor layer is eliminated.

Another object of the present invention is to provide a contact structure for connecting a semiconductor layer forming a part of a semiconductor device to a wiring electrode through a contact hole wherein reaction between the semiconductor layer and the wiring electrode is effectively suppressed by a diffusion barrier layer even when the contact hole has a large aspect ratio.

Another object of the present invention is to provide a contact structure for connecting a semiconductor layer constituting a part of a semiconductor device to a wiring electrode through a contact hole provided on an insulator layer covering the semiconductor layer, wherein there is provided a first contact layer at a boundary between the semiconductor layer and the insulator layer in correspondence to the contact hole such that the first contact layer extends laterally along the boundary beyond the contact hole. A second contact layer is formed on the first contact layer in correspondence to the contact hole such that the second contact layer covers the first contact layer at the bottom of the contact hole and extends upwards from the first contact layer along a side wall of the contact hole. A diffusion barrier layer provided on a surface of the second contact layer is so as to be sandwiched between the second contact layer and the wiring electrode for preventing diffusion of component elements of the semiconductor layer and the wiring electrode passing therethrough. According to the contact structure of the present invention, the first contact layer extending laterally along the boundary between the semiconductor layer and the insulator layer has a substantially flat bottom surface and formation of a projection or spike projecting into the semiconductor layer to such an extent that a shallow junction formed in the semiconductor layer is shorted by such a projection is avoided. The bottom of the first contact layer is maintained flat, as silicon is collected from the semiconductor layer uniformly by the widely extending first contact layer during the formation of the second contact layer. Further, the deposition of the wiring electrode in such a contact structure is facilitated as the second contact layer covering the the side wall as well as the bottom of the contact hole has a concaved surface opened upwards. Further, as a result of the existence of the first contact layer extending laterally beyond the contact hole at the boundary between the insulator layer and the semiconductor layer, area for electrical connection is increased and there is achieved an excellent electrical contact between the wiring electrode deposited on the second contact layer which in turn is contacted with the first contact layer at the bottom of the contact hole and the semiconductor layer located underneath the first contact layer. As a result of the reduced resistance in the structure, one can reduce the size of the contact hole which in turn enables miniaturization of the semiconductor device. Furthermore, the reaction between the wiring electrode and the semiconductor layer across the first and second contact layers is effectively suppressed by the diffusion barrier layer formed on the surface of the second contact layer. In such a structure, the diffusion barrier is easily formed as a thin layer having a uniform thickness by reacting the surface of the second contact layer with a suitable atmospheric gas. Alternatively, the diffusion barrier layer may be formed by depositing a suitable material on the surface of the second contact layer prior to the deposition of the conductor layer. It should be noted that the concaved surface of the second contact layer facilitates the uniform deposition of such a material.

Another object of the present invention is to provide a method of forming a contact structure for connecting a wiring electrode to a semiconductor layer forming a part of a semiconductor device through a contact hole provided on an insulator layer covering a surface of the semiconductor layer such that an electrical contact is achieved between the wiring electrode and the semiconductor layer via a first contact layer at a boundary between the semiconductor layer and the insulator layer including area of the contact hole and extending beyond the contact hole and a second contact layer provided on the first contact layer in correspondence to the contact hole and extending upwards along a side wall of the contact hole, wherein the first contact layer is formed at first by reacting a first metal layer deposited in correspondence to the first contact layer with the semiconductor layer at a relatively low temperature to form a precursor compound. Then the layer of the precursor compound and a second metal layer deposited in correspondence to the second contact layer are simultaneously heated at a relatively high temperature so that the precursor compound is changed to a desired compound having a low resistivity. At the same time the second contact layer of the desired compound is formed as a result of reaction between the semiconductor layer and the second metal layer across the first contact layer. According to the present invention, the heat treatment of the semiconductor device at the high temperature for changing the precursor compound to the desired compound is applied only once and thus deteriorative effect associated with heating on various parts of the device is minimized. Further, it is possible to form a layer of diffusion barrier on a surface of the second contact layer simultaneously at the time the first and second contact layers are formed by a reaction with an atmospheric gas. Thus, the step to form such a structure is simplified.

Still other objects and further features of the present invention will become apparent from the following detailed description when read in conjunction with attached drawings.

DETAILED DESCRIPTION

Figure 3A:
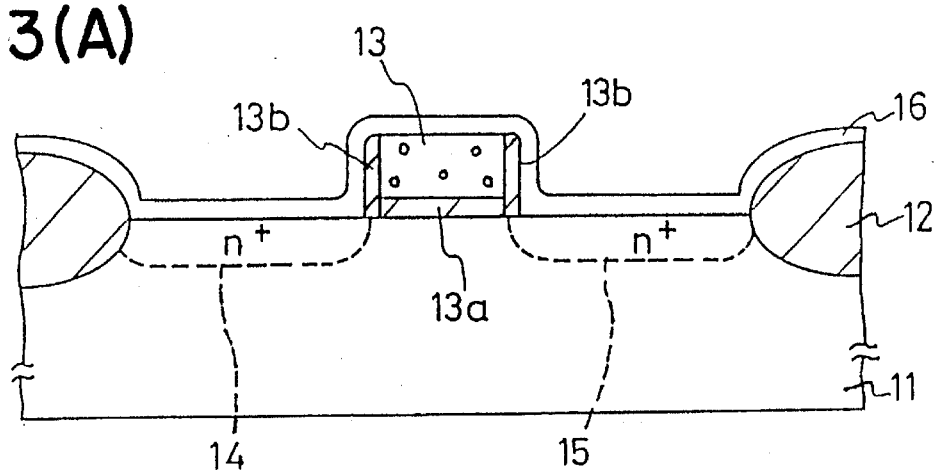
FIGS. 3(A)–3(E) are diagrams showing steps of forming a MOS transistor having a contact structure according to an embodiment of the present invention.

FIG. 3(A)–(E) show steps of forming a so called "salicide" or self-aligned silicide contact structure according to an embodiment of the present invention for an n-channel type MOS structure. Referring to FIG. 3(A), a known MOS structure is constructed in an area of a p-type substrate 11 defined by a field oxide layer 12. The MOS structure has an $n^+$-type source region 14 and an $n^+$-type drain region 15 both formed in the substrate 11 in correspondence to the area defined by the field insulator layer 12. Doping of the p-type substrate 11 corresponding to the source and drain regions 14 and 15 may be achieved by well known ion implantation of arsenic ion ($As^+$) or phosphorus ion ($P^+$). On the substrate 11, there is provided a gate insulator film 13a which may be an oxide film formed as a result of oxidation of the substrate 11, and a polysilicon gate electrode 13 is deposited on the gate insulator film 13a. Further, the side wall of the gate electrode 13 is covered by another insulator layer 13b formed by oxidation of side wall portion of the gate electrode 13. In this state, only the source and drain regions 14 and 15 as well as the top surface of the gate electrode 13 are exposed.

Figure 3B:
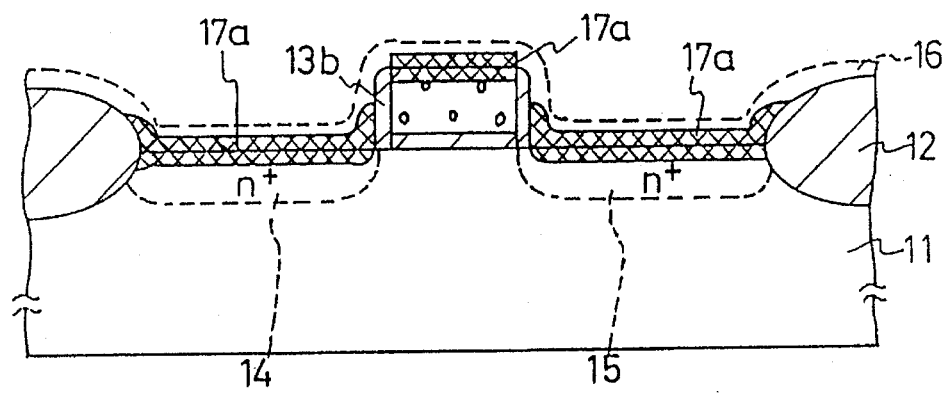

In a step of FIG. 3(A), titanium is deposited on the aforementioned MOS structure by sputtering and the like, whereby a layer of titanium 16 covering the entire surface of the structure is formed with a thickness of about 400 Å or more. In the illustrated example, the sputtering of titanium is made by D.C. magnetron sputtering with a power of 4 kW using argon gas of about 3 mTorr pressure. The structure thus obtained is then annealed at a temperature of about 600°–700° C. in an inert atmosphere such as nitrogen for a short time period such as one minute, whereby a self-aligned structure of silicide shown in FIG. 3(B) is obtained. Such a heat treatment for very short time period may be achieved by using a rapid thermal anneal (RTA) technique. Referring to FIG. 3(B), there is formed a layer of silicide 17a in correspondence to the exposed regions 13, 14 and 15 as a result of reaction between titanium in the layer 16 and silicon in the exposed region underneath. Such a silicide layer formed by the aforementioned annealing mainly contains titanium monosilicide TiSi with a small amount of titanium disilicide $TiSi_2$ and other titanium-based silicide compound such as $Ti_5Si_3$. As a whole, the silicide in the layer 17a obtained in this stage is represented as $TiSi_x$.

As is commonly known, layer of silicide formed as such grows along the insulator layer beyond the exposed region of the substrate. Thus, it can be seen that the silicide layer 17a not only covers the exposed source and drain regions 14 and 15 but extends beyond such regions along the field insulator layer 12 as well as along the insulator layer 13b at the side wall of the gate electrode 13. When the extension of the layer 17a, particularly those along the side wall 13b of the gate electrode 13 is excessive, there is a risk that a part of the layer 17a makes contact with the silicide layer 17a covering the top surface of the gate electrode 13. By limiting the temperature and duration of the annealing to such a low temperature and extremely short duration, such an excessive extension of the silicide layer 17a along the side wall 13b of the gate electrode 13 is eliminated. After the formation of the silicide layer 17a, an unreacted part of the titanium layer 16 is removed by etching. The etching may be made by an isotropic etching using a solution of hydrogen peroxide ($H_2O_2$) and ammonium hydrate ($NH_4OH$) at 60° C. with a concentration level which may be chosen as $H_2O_2$: $NH_4OH$: $H_2O=1.5:1:4$, for example.

Figure 3C:
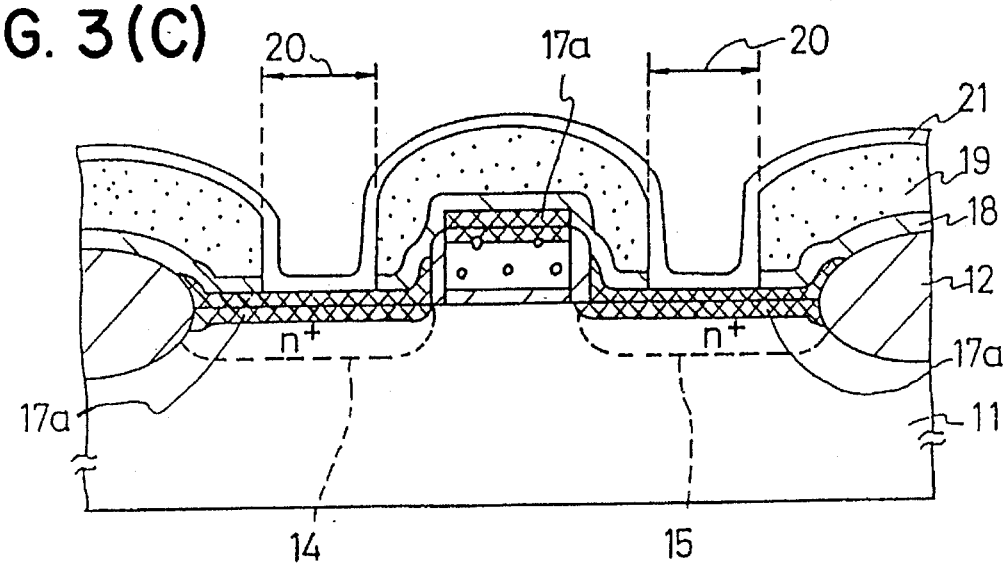

Next, a silicon dioxide layer 18 and a PSG layer 19 are deposited successively on the entire structure of FIG. 3(B) so that the silicide layer 17a is buried under the silicon dioxide layer 18, and a contact hole 20 is opened through the layers 18 and 19 in correspondence to the source and drain regions 14 and 15 by anisotropic etching such as reactive ion etching (RIE) so as to expose a part of the silicide layer 17a covering the regions 13, 14 and 15 as shown in FIG. 3(C), though the contact hole for the gate electrode 13 is not illustrated for the sake of clarity of the drawing. It should be noted that the contact hole 20 does not expose the entire contact layer 17a but only a part of it. In other words, the silicide layer 17a extends laterally between beyond the contact hole 20 along a boundary between the substrate 11 and the insulator layers 18 and 19. Next, another titanium layer 21 is deposited on the entire structure thus obtained as shown in FIG. 3(C) such that the titanium layer 21 covers the exposed contact layer 17a at the bottom of the contact hole 20 as well as the surface of the PSG layer 19 including a part defining the side wall of the contact hole 20. The deposition of the titanium layer 21 is made similarly to the case of the deposition of the titanium layer 16. Thus, the thickness of the titanium layer 21 is made equal to or larger than about 400 Å.

Figure 3D:
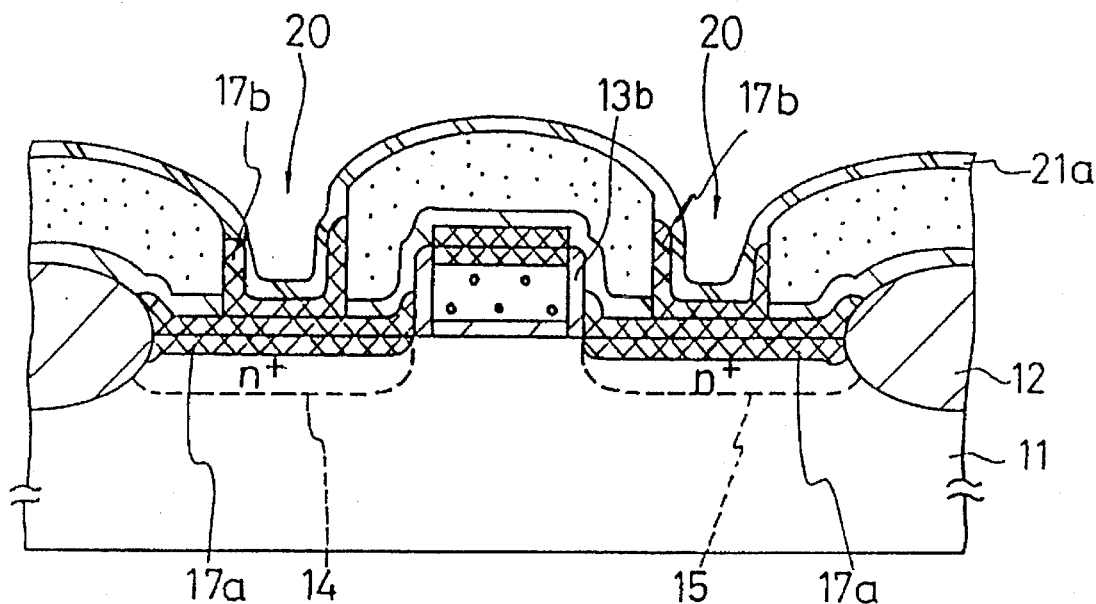

Next, the entire structure of FIG. 3(C) is annealed at a temperature of about 900° C. for several tens of minutes under a nitrogen or ammonia atmosphere. As a result, another silicide layer 17b is formed along the inner surface of the contact hole 20 as shown in FIG. 3(D) as a result of reaction between silicon supplied to the titanium layer 21 from the substrate 11 through the first silicide layer 17a. Experimentally, it is found that a same structure is obtained by annealing at a temperature of 600°–900° C. Silicon supplied from the substrate 11 through the first silicide layer 17a migrates along the side wall of the contact hole, and the second silicide layer 17b thus formed extends upwards from the bottom along the side wall of the contact hole. In exchange with the flow of silicon, titanium flows from the titanium layer 21 along a reversed diffusion path through the first and second silicide layers 17a and 17b to the substrate 11. As the temperature of annealing is substantially higher than that of the first annealing applied at the time of formation of the first silicide layer 17a, the degree of extension of the second silicide layer 17b along the side wall of the contact hole 20 is much larger than the extension of the first silicide layer along the field isolation structure 12 or along the insulator layer 13b at the side wall of the gate electrode 13. Further, it should be noted that the first silicide layer 17a covering the field isolation layer 12 or the oxide film 13b of the gate electrode 13 is buried under the silicon dioxide layer 18 except for those exposed by the contact hole 20, so that there occurs no further growth or extension of the first silicide layer 17a beyond the state of FIG. 3(C) even in the second annealing performed at a higher temperature. Thus, the risk that the first silicide layer 17a covering the source or drain regions 14, 15 grows excessively and makes a contact with the silicide layer 17a covering the top surface of the gate electrode 13 is eliminated. By the second annealing, the silicide of the first silicide layer 17a mostly comprised of titanium monosilicide changes to titanium disilicide having a low resistivity. At the same time as the formation of titanium disilicide, the rest of the titanium layer 21 which remains unreacted with silicon is reacted with nitrogen in the atmosphere and there is formed a layer of titanium nitride 21a acting as a diffusion barrier layer.

Figure 3E:
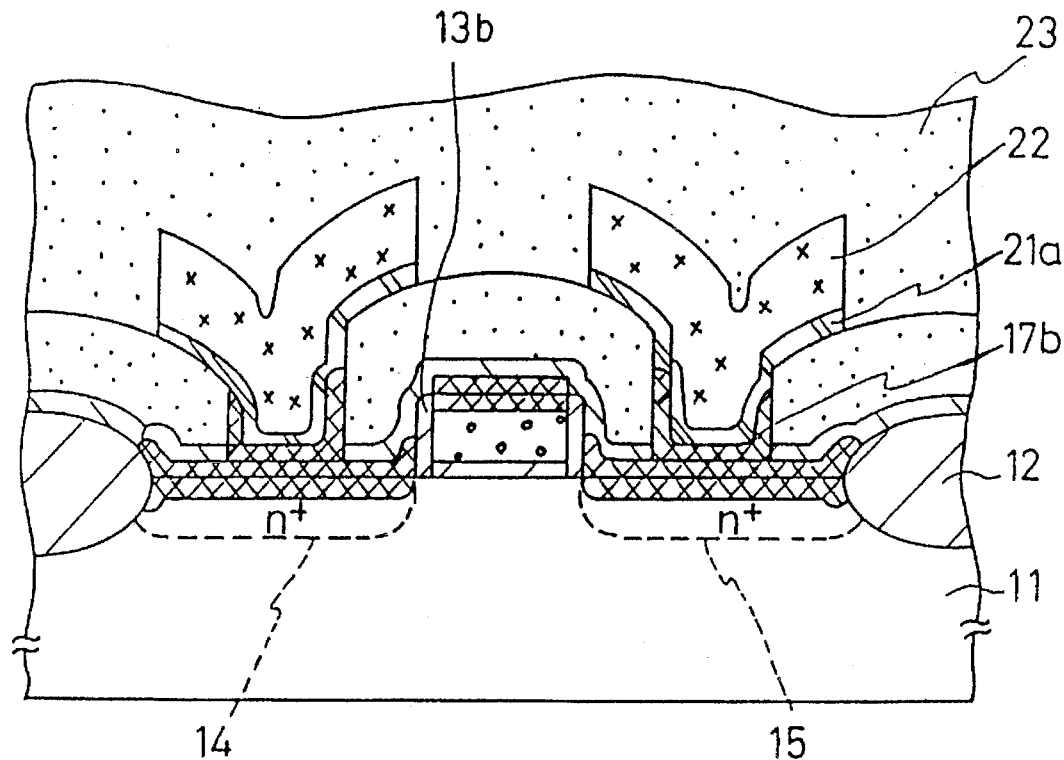

Next, in a step shown in FIG. 3(E), a wiring electrode 22 is deposited on the entire structure of FIG. 3(D) and then patterned together with the titanium nitride layer 21a according to a desired wiring pattern. Further, the entire structure is protected by another PSG layer 23.

Figure 1:
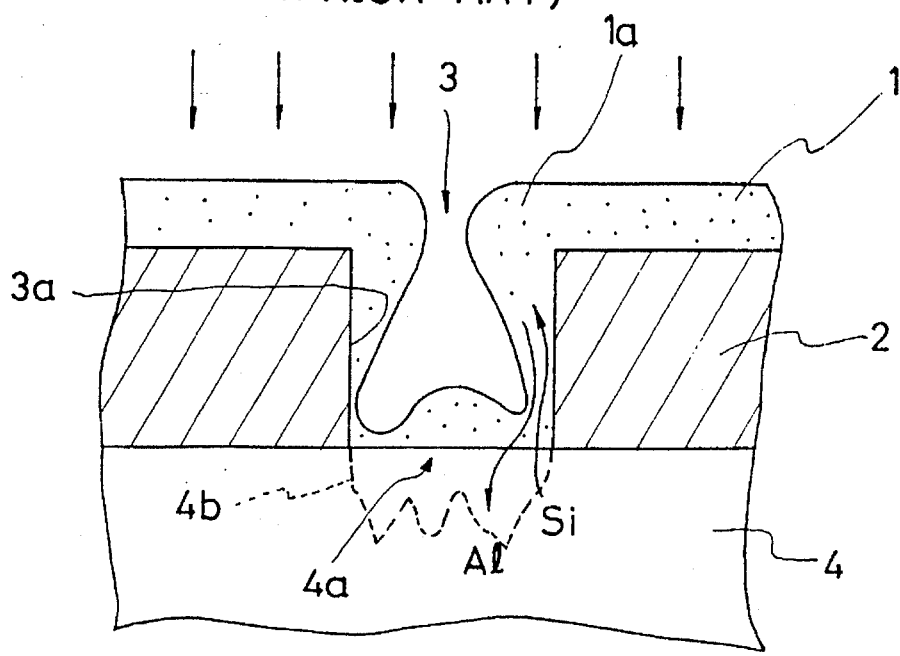
FIG. 1 is a cross sectional view showing a typical prior art contact structure and problems associated therewith.
Figure 2:
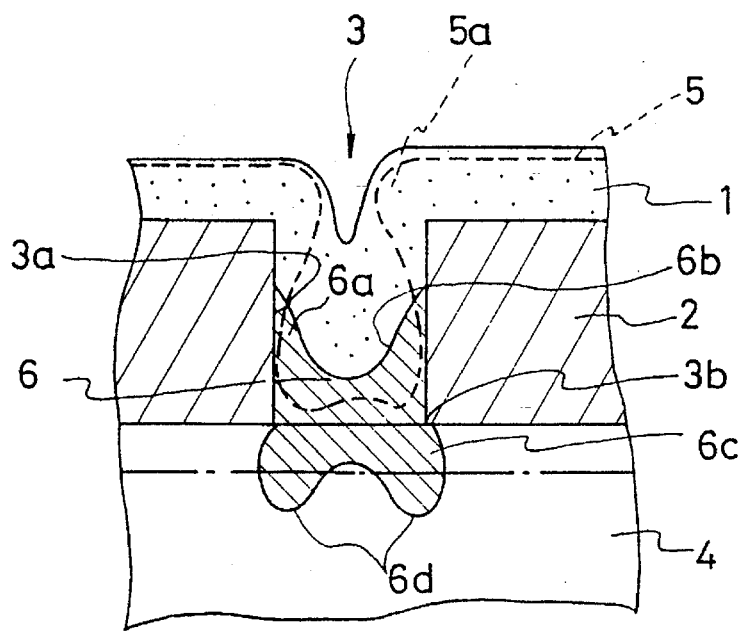
FIG. 2 is a cross sectional view showing a another prior art contact structure and problems associated therewith.

The completed contact structure of FIG. 3(E) has various advantages. First, it has the second silicide layer 17b covering the bottom as well as the side wall of the contact hole 20 and the first silicide layer extending laterally at the boundary between the substrate 11 and the insulator layers 18 and 19 beyond the contact hole 20. Thus, there is achieved an excellent electrical contact between the wiring electrode 22 and the substrate 11 as a result of increased contact area. Further, the second silicide layer 17b has a concaved profile opened upwards in which the thickness of the layer is largest in the bottom part of the contact hole 20 and becomes gradually small towards the top along the side wall of the contact hole 20. On a part having such a profile, there is no difficulty in depositing the wiring electrode 22 by commonly used technique of sputtering and the like. In other words, the deposition of the wiring electrode on the second silicide layer 17b can be made without causing problem even if the diameter of the contact hole is reduced in association with the miniaturization of the semiconductor device and the aspect ratio of the contact hole is increased accordingly. Further, the contact structure of FIG. 3(E) is substantially free from spikes or projections projecting from the bottom of the first contact layer 17a into the region 14 or 15 of the substrate 11. This is because silicon consumed for the growth of the second silicide layer 17b is collected from a wide area of the substrate 11 covered by the first silicide layer 17a uniformly. Correspondingly thereto, the first silicide layer 17a grows towards the substrate 11 uniformly for a minute distance as a result of supply of titanium from the titanium layer 21. Thus, localized growth of the first silicide layer 17a towards the substrate 11 bringing the formation of the spike as in the case of prior art structure of FIG. 2 is avoided and the formation of spike or projection which cause short-circuit conduction across the source or drain region 14, 15 is successfully suppressed. In the procedure of FIGS. 3(A)–(E), it should be noted that the annealing of the structure at the high-temperature for substantial period of time is made Only once, so that deteriorative effect of heating which may change the distribution profile of impurities in the device is minimized. Associated therewith, the process of formation of the contact structure is simplified. Further, the diffusion barrier layer 21a is formed simultaneously to the formation of the second contact layer 17b.

Figure 4A:
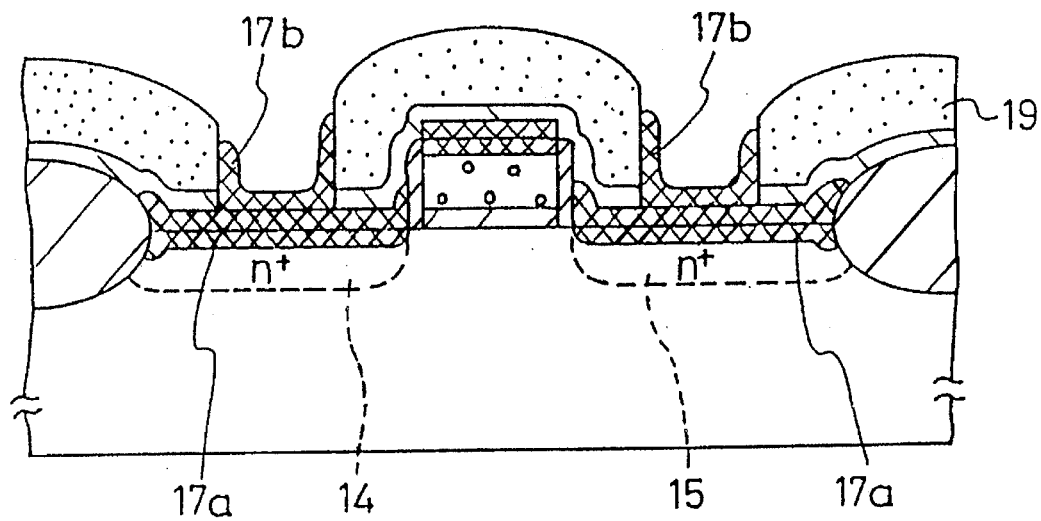
FIGS. 4(A) and 4(B) are diagrams showing steps of forming a MOS transistor having a contact structure according to another embodiment of the present invention.

FIGS. 4(A) and (B) show an alternative process of forming a self-aligned contact structure according to a second embodiment of the present invention. As the steps corresponding to those of FIGS. 3(A)–(C) are common, the illustration and description of such steps will be omitted. Further, those parts constructed identically to these corresponding parts of the preceding drawings are given identical reference numerals and the description thereof will be omitted.

Figure 4B:
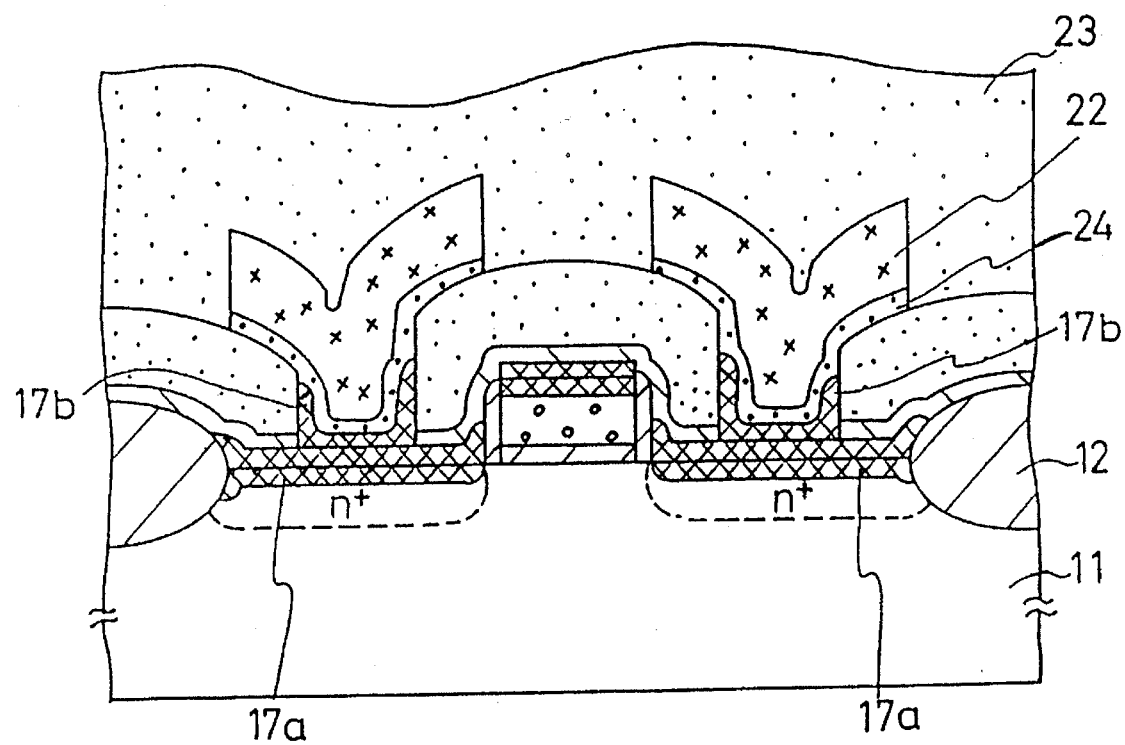

Referring to FIG. 4(A), the second contact layer 17b is grown on the first silicide layer 17a similarly to the case of FIG. 3(D) except that the second annealing for the formation of the second silicide layer 17b is made in argon. The temperature and duration of the second annealing is substantially the same as in the case of the first embodiment. The annealing in argon provides advantage in that there is formed an extensive growth of the second silicide layer 17b along the side wall of the contact hole 20. In this embodiment, the titanium nitride layer is not formed. Thus, after the formation of the second silicide layer 17b, the unreacted part of the titanium layer 21 is removed by etching similarly to the case of the titanium layer 16. Next, a desirable material for diffusion barrier such as titanium tungstenite is deposited on the structure of FIG. 4(A) as a diffusion barrier layer 24. After the deposition of aluminium wiring electrode 22 and patterning together with the diffusion barrier layer 24, the entire structure is protected by the PSG layer 23 similarly to the case of the first embodiment and a completed structure is obtained as shown in FIG. 4(B).

In this embodiment, the material for the diffusion barrier layer is not limited to titanium nitride but any desirable material such as titanium tungstenite may be used for the diffusion barrier layer. As the second silicide layer has the concaved profile opened upwards as already described, there is no difficulty in depositing the diffusion barrier layer by commonly used technique such as sputtering. Further, it is also possible to provide the titanium nitride layer as the diffusion layer by changing the atmosphere from argon to nitrogen when the structure of FIG. 4(A) is formed. In this case, one can obtain an extensively grown structure of the second silicide layer 17b along the side wall of the contact hole 20 in a same processing apparatus by simply changing the atmospheric gas while suppressing the growth of the first silicide layer 17a along the side wall 13b of the gate electrode 13 by the insulator layers 18 and 19. In this embodiment, too, the formation of projection or spike into the source or drain region of the substrate 11 as a result of the formation of the second silicide layer 17b is suppressed as a result of use of the first silicide layer 17a which spreads the area used for exchange of titanium and silicon between the the substrate and the silicide layers.

Further, the compound for the first and second silicide layers is not limited to titanium disilicide but other compounds may be used as well. The device to which the contact structure of the present invention is applicable is not limited to MOS transistors as illustrated, but the contact structure of the present invention is applicable to any other devices such as bipolar transistors as well.

Further, the present invention is not limited to these embodiments but various variations and modifications may be made without departing from the scope of the present invention.

What is claimed is:

1. A method of forming a contact structure for connecting a semiconductor device to a wiring electrode, comprising the steps of:

depositing a first metal on a surface of a semiconductor layer constituting a part of the semiconductor device to form a first metal layer in contact with the semiconductor layer, said first metal being chosen such that it reacts with the semiconductor layer when annealed;

annealing the first metal layer at a first temperature to form a first contact layer as a result of reaction between the semiconductor layer and the first metal;

depositing an insulator material on the first contact layer to form an insulator layer such that the first contact layer is buried under the insulator layer;

providing a penetrating hole through the insulator layer so as to expose a part of the first contact layer;

depositing said first metal on the insulator layer in correspondence to the penetrating hole so as to cover at least said part of the first contact layer exposed by the penetrating hole to form a second metal layer;

annealing at a second temperature higher than the first temperature to form a second contact layer as a result of reaction due to the second temperature between the first metal of the second metal layer and the semiconductor layer through the first contact layer; and depositing the wiring electrode on the second metal layer.

2. A method as claimed in claim 1 in which said step of forming the second contact layer comprises a step of growing the second contact layer along a side wall of the penetrating hole.

3. A method as claimed in claim 1 in which said step of annealing to form the second contact layer is in an atmosphere containing nitrogen.

4. A method as claimed in claim 3 in which said step of annealing the structure further comprises a step of forming a layer of nitride compound on a surface of the second contact layer.

5. A method as claimed in claim 1 in which said step of annealing to form the second contact layer is in an atmosphere containing argon.

6. A method as claimed in claim 5 in which said step of annealing to form the second contact layer further comprises the steps of removing unreacted metal, and depositing a diffusion barrier layer on the second contact layer.

7. A method as claimed in claim 5 further comprising a step of annealing at the second temperature in an atmosphere containing nitrogen after the step of annealing in argon.

* * * * *